(12) United States Patent
Chou

(10) Patent No.: US 6,798,802 B2
(45) Date of Patent: Sep. 28, 2004

(54) HIGH-SPEED LASER DRIVER INCLUDING WAVE-SHAPING CIRCUITS

(75) Inventor: Min-Chung Chou, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 209 days.

(21) Appl. No.: 10/166,978

(22) Filed: Jun. 11, 2002

(65) Prior Publication Data

US 2003/0169791 A1 Sep. 11, 2003

(30) Foreign Application Priority Data

Mar. 11, 2002 (TW) ........................................ 91104506 A

(51) Int. Cl.[7] ................................................ H01S 3/00
(52) U.S. Cl. .............................. 372/38.02; 372/38.04; 372/38.07; 327/110; 327/112
(58) Field of Search ........................... 372/38.02, 38.04, 372/38.07; 327/110, 112

(56) References Cited

U.S. PATENT DOCUMENTS

| | | | | |
|---|---|---|---|---|
| 5,563,898 A | * | 10/1996 | Ikeuchi et al. ............ | 372/38.07 |
| 5,739,707 A | * | 4/1998 | Barraclough ................ | 327/112 |
| 5,828,247 A | * | 10/1998 | Moller et al. ................ | 327/110 |
| 6,021,143 A | * | 2/2000 | Ransijn et al. ............ | 372/38.02 |
| 6,130,562 A | * | 10/2000 | Bosch et al. ............. | 372/38.02 |
| 6,590,914 B1 | * | 7/2003 | Tanase et al. ............ | 372/38.02 |
| 6,597,209 B2 | * | 7/2003 | Iguchi et al. ............ | 372/38.02 |
| 2003/0002551 A1 | * | 1/2003 | Kwon et al. ............. | 372/38.02 |
| 2003/0086455 A1 | * | 5/2003 | Ciubotaru et al. ........ | 372/38.02 |
| 2003/0156609 A1 | * | 8/2003 | Tsai ......................... | 372/38.02 |

* cited by examiner

Primary Examiner—Don Wong
Assistant Examiner—Cornelius H. Jackson
(74) Attorney, Agent, or Firm—Fish & Richardson P.C.

(57) ABSTRACT

A high-speed laser driver for signal noise on the electrical analysis point. The driver includes a power supply, for providing a test voltage in the system; a pulse generator, for providing a test frequency in a noise testing of the system; a regulable test IC with different signal pads capable of regulable testing signal noise with the test frequency from the pulse generator and the test voltage from the power supply in a plurality of built-in specific structures, under the basis of an assigned current standard; and a digital detection device with a display, for displaying and recording the result of the regulable test.

13 Claims, 9 Drawing Sheets

HIGH-SPEED LASER DRIVER INCLUDING WAVE-SHAPING CIRCUITS

Pursuant to 35 U.S.C. §119(a)–(d), this application claims priority from Taiwanese application no. 91104506, filed on Mar. 11, 2002.

BACKGROUND OF THE INVENTION

1. Field of the Invention

The present invention relates to a laser driver, and especially to a high-speed laser driver including wave shaping and dynamic control circuits, which uses a source degeneration resistor instead of a prior constant current source to increase the operating speed, a buffer with a dynamic loading source resistor to buffer the output differential signals to the next circuit, and a tunable device to control output gain and prevent overshoot.

2. Description of Related Art

FIG. 1 is a block diagram of a typical laser driver 10. As shown in FIG. 1, the laser circuit 10 includes a wave-shaping circuit 11 to receive and shape signals Sdp and Sdn externally, an output control circuit 12 to adjust signals Sdp and Sdn to desired signals Swu and Swl, and an output stage circuit 13 to convert signals Swu and Swl into a desired output I for the laser diode 14 by externally inputting the signal CG to set the desired modulation current. As such, the laser circuit 10 drives the modulation current Im of a laser diode 14. When the laser diode 14 functions, the required bias voltage is provided by a bias current source 15. However, for high-speed and broadband (NRZ signal) requirements of laser drivers, such a conversional MOS constant current source differential pair structure cannot meet the design specification because the speed limitation comes from the parasitic capacitance and some physical behavior of MOS devices. Thus, the laser drive with the conversional structure has poor performance. For example, FIG. 2 is an example of the wave-shaping circuit 11 of FIG. 1. As shown in FIG. 2, the wave-shaping circuit 11 has constant current source differential pairs. These constant current source differential pairs serve as gain stages and limit the output swing to a desired level. For simplification, only the last differential stage 111 consisting of resistors R1, R2, MOSs M1, M2, and a constant current source CS1 is shown. Further, circuit 112 serves as an output stage to drive the next circuit and adjusts the output voltage level to a desired swing. A wave-shaping circuit like 11 can convert a differential sine wave pair Sdp, Sdn into a differential square wave pair Swu, Swl or a single-end signal into a differential pair (not shown). However, as mentioned above, the operating speed of a constant current source differential pair is limited by the non-ideal characteristics and of MOS current source. Thus, as shown in FIG. 3, a parasitic capacitance Cp is formed due to the junction voltage difference Vd–Vb between the drain D and bulk B of the MOS, for example M1 (FIG. 2) when an external current Iext is input to the drain D of M1. The parasitic capacitance Cp causes the current source CS1, CS2 and CS3 in FIG. 2 to be non-ideal current sources such that the operating speed of the differential pair M1, M2 is limited. When operating at high speed, the total current of NMOSs M1 and M2 is equal to the current of CS1 in ideal. However, the parasitic capacitance Cp in the non-ideal constant current sources can cause signal distortion. For example, when a 0.35 µm CMOS manufacturing process is used to shape a 1.25G clock pulse, as shown in FIG. 4, the signal such as Swu may change the waveform from V1 to V2 and cause a signal distortion. If the signals Swu, Swl are unchanged, and sent to the next output control circuit 12, as shown in FIG. 5, the circuit 12 also includes MOSs M51–53, causing output signal distortion. That is, the MOS M53 becomes a non-ideal constant current source and the signals Sout1, Sout2 sent to the next output stage circuit 13 (FIG. 1) change the waveform from V1 to V2 (FIG. 4) so as to cause output signal distortion. Likewise, the waveform distortion may present in the output stage circuit 13 consisting of, for example, a resistor R53, MOSs M54–M56 as mentioned above.

SUMMARY OF THE INVENTION

Accordingly, an object of the invention is to provide a high-speed laser driver including a wave-shaping circuit, which performs wave shaping for the laser driver at high speeds.

Another object of the invention is to provide a high-speed laser driver including wave-shaping and dynamic control circuits, which performs the wave shaping and the dynamic control for the laser driver at high speed.

The invention provides a high-speed laser driver including wave-shaping circuits, which performs wave shaping for driving the laser at high speed. The laser driver includes a wave-shaping circuit having a source degeneration resistor instead of a prior constant current source to increase the operating speed and a buffer with a dynamic loading source resistor to buffer the output differential signals to the next circuit. The laser driver further includes a dynamic control circuit having a tunable device to control output gain and prevent overshoot.

DETAILED DESCRIPTION OF THE INVENTION

Figure 6:
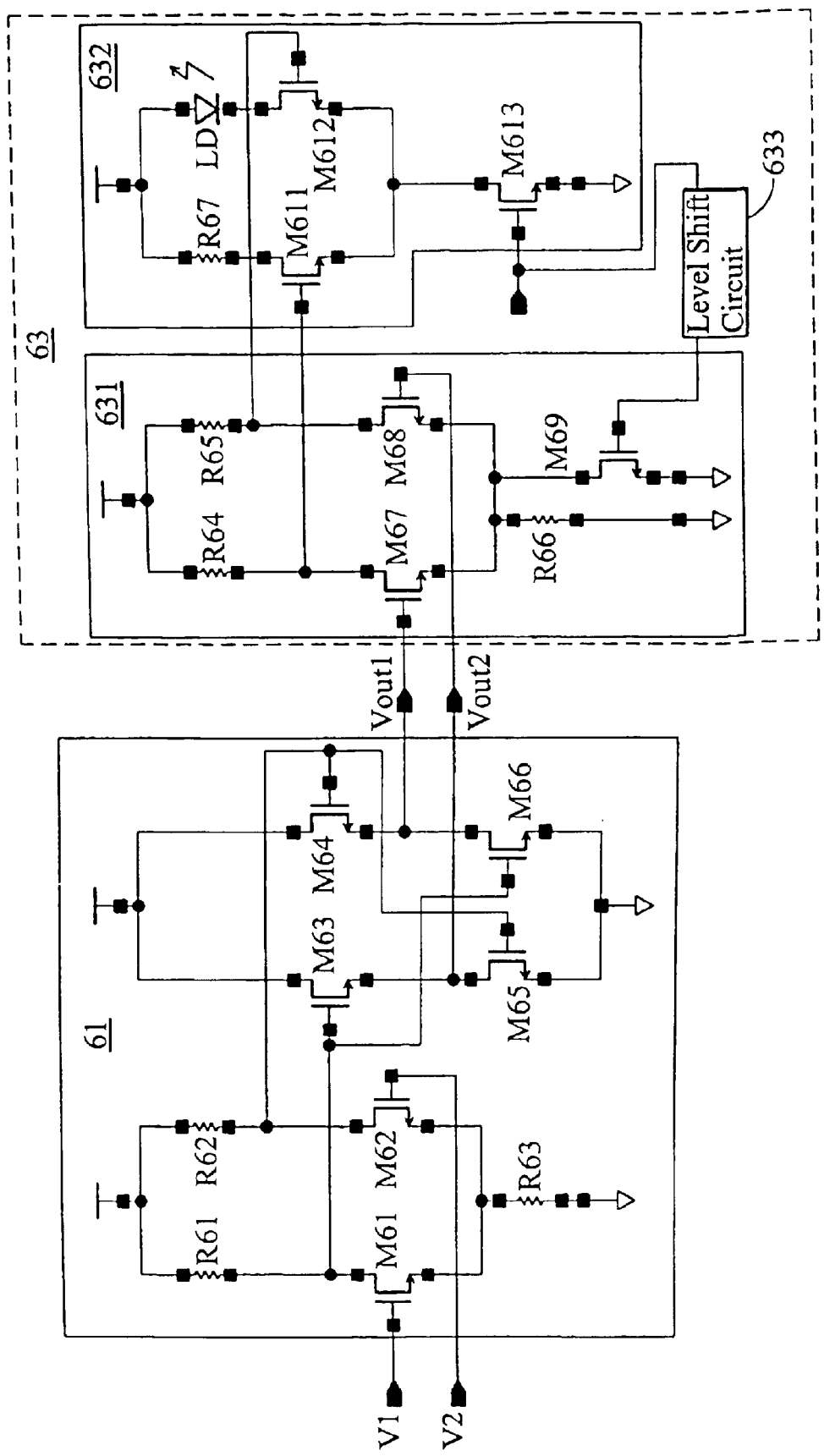
FIG. 6 shows a circuit diagram of a high-speed laser driver according to the invention.
Figure 7:
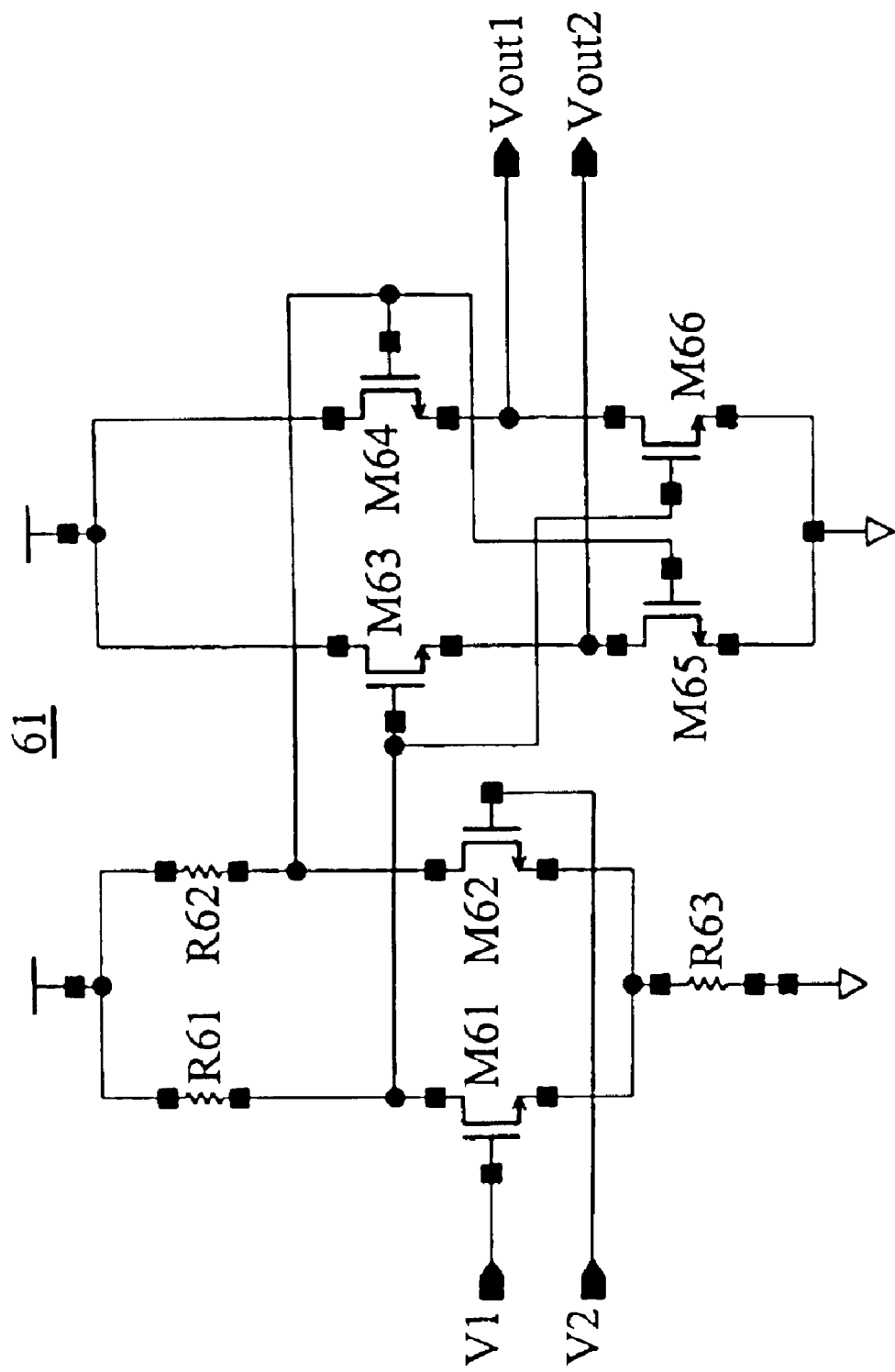
FIG. 7 is an enlarged view of the wave-shaping circuit of FIG. 6 according to the invention.
Figure 8:
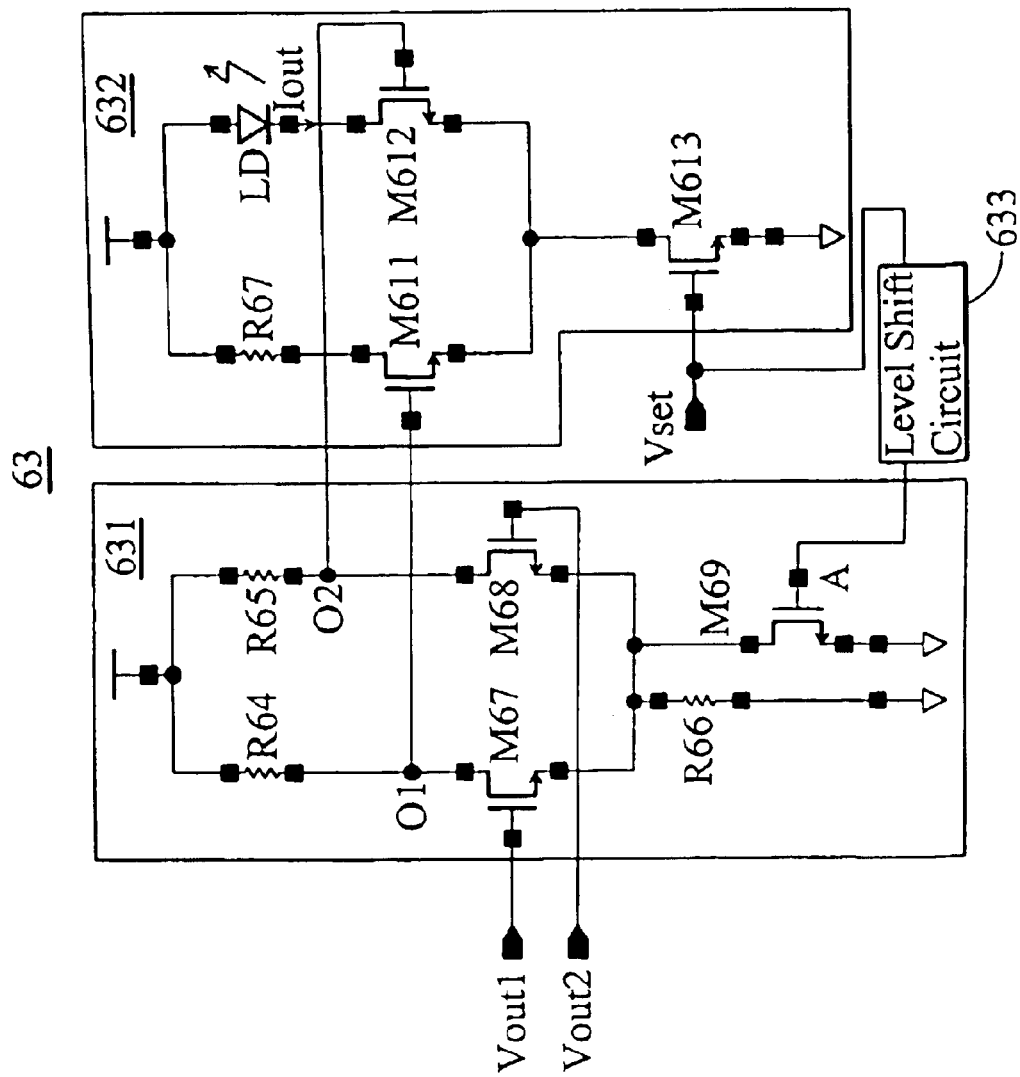
FIG. 8 is an enlarged view of the dynamic control circuit and the output stage circuit of FIG. 6 according to the invention.
Figure 9:
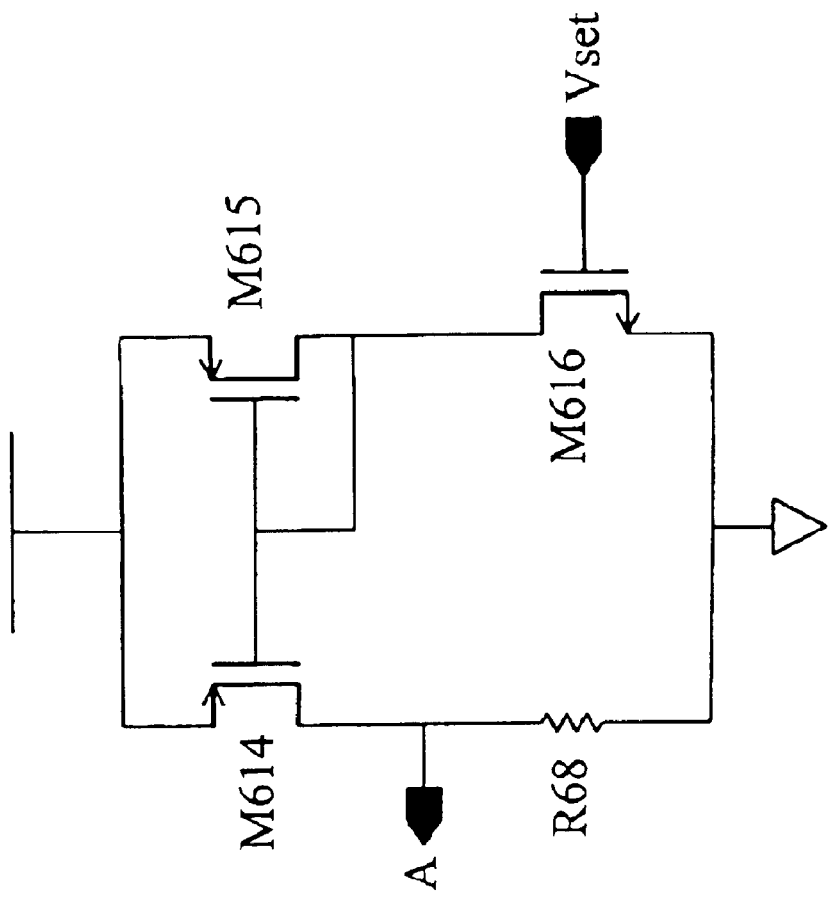
FIG. 9 is an example of the level shift circuit of FIG. 6 according to the invention.

FIG. 6 shows a circuit diagram of a high-speed laser driver according to the invention. In FIG. 6, the high-speed laser driver includes: a wave-shaping circuit 61, a dynamic control circuit 631, an output stage circuit 632 and a level shift circuit 633. As shown in FIG. 6, for simplification, only a wave-shaping circuit 61 is shown. In practice, multiple cascade wave-shaping circuits are generally used to achieve a desired wave shaping output for driving the next output stage. More detailed description is shown in FIGS. 7–9. FIG.

7 is an enlarged view of the wave shaping 61. FIG. 8 is an enlarged view of the dynamic control circuit 631 and the output stage circuit 632. FIG. 9 is an embodiment of the level shift circuit 633.

As shown in FIG. 7, the wave-shaping circuit 61 includes a shaping stage and a buffering stage. The shaping stage is formed by resistors R61–R63 and an NMOS differential pair M61, M62. The buffering stage is formed by two NMOS differential pairs M63–M66. The differential pair M61, M62 determine the total current on the resistor R63. When an input signal swing to the differential pair M61, M62 is too small, the differential pair M61, M62 are both turned on to amplify the input signal swing. On the other hand, when the input signal swing to the differential pair M61, M62 is too large, one of the differential pair M61, M62 is turned on and the other is fully turned off, so as to reduce the input signal swing. Such a shaping stage can work at high speed without use of the non-ideal constant current source and thereby avoiding the distortion. In addition, the buffering stage follows the shaping stage as an output buffer to meet the requirement as multiple shaping stages are connected in series and further provide desired high speed operation without distortion. The devices M65, M66 serve as dynamic loading source resistor. The devices M65, M66 work either in saturation region or in triode region to respectively determine the current on device M63 and M64. The equation: output stage voltage level (V)=current (I) X resistance (R) can determine a desired output voltage level by adjusting the values of a resistor and the current flowing on the resistor. Therefore, for a low voltage level, the device M65 or M66 changes to work in triode region for a lower resistance. On the other hand, for a high voltage level, the device M65 or M66 changes to work in saturation region for a higher resistance. As such, this dynamic loading buffer improves the speed performance and the driving power compared to the prior art. In practice, because the input signal may be very small, multiple wave-shaping circuits like the device 61 cascade are necessary so that a sine wave input signal can be converted into a desired square wave output signal (see signals Swu, Swl of FIG. 1). The devices M65 and M66 can be a tunable resistor.

As shown in FIG. 8, the dynamic control circuit 631, the output stage circuit 632 and the level shift circuit 633 form an output stage 63. The circuit 631 is formed by resistors R64–R66 and NMOSs M67–M69. The circuit 632 is formed by NMOSs M611–M613. A resistor R67 and a laser diode LD can be the external circuits. The resistor R67 is optional. The laser diode 14 acts as a signal output device of this driver. In the circuit 631, the device M69 serves as a tunable resistor and operates in triode region. In the circuit 632, the device 613 is controlled by the control voltage Vset and operated in saturation region acting as a driving source of the output current Iout. Due to the different operating region, the gate voltage of M69 is higher than that of M613. For a larger current in M613, the voltage Vset to the gate of M613 is set higher. In addition, the gate voltage of M69 must be higher for a suitable value to create larger output swings of R64 and R65 to the stage 632 through output terminal O1 and O2 to make sure M611 or M612 fully turned off to prevent overshoot. For a smaller current in M613, the voltage Vset to the gate of M613 is set lower. Also, the gate voltage of M69 must be lower for a suitable value to create smaller output swings of R64 and R65 to the stage 632 through output terminal O1 and O2 to make sure that M611 or M612 are fully turned off to prevent overshoot. The level shift circuit 633 can be any kind of level shift circuit meeting the requirement of operating with the circuits 631 and 632. An example of the level shift circuit 633 is given in FIG. 9 and described in the following.

As shown in FIG. 9, the circuit 633 is formed by PMOSs M614, M615, an NMOS M616 and a resistor R68. For a larger current in M613, the voltage Vset to the gate of M613 is set higher so that the voltage to the gate of M616 is higher. Thus, the falling voltage on R68 is higher and the gate voltage of M69 input through an output terminal A (FIGS. 8 and 9) is higher and suitable to create a higher falling voltage swing on R64 and R65. The higher falling voltages on R64 and R65 are sent to the stage 632 through the output terminals O1 and O2, respectively, to make sure the device M611 or M612 is fully turned off to prevent overshoot. For a smaller current in M613, the voltage Vset to the gate of M613 is set lower so that the voltage to the gate of M616 is smaller. Thus, the falling voltage on R68 is smaller and the gate voltage of M69 input through an output terminal A (FIGS. 8 and 9) is smaller and suitable to create a smaller falling voltage swing on R64 and R65. The smaller falling voltages on R64 and R65 are sent to the stage 632 through the output terminals O1 and O2, respectively, to make sure the device M611 or M612 is fully turned off to prevent overshoot.

Figure 1:
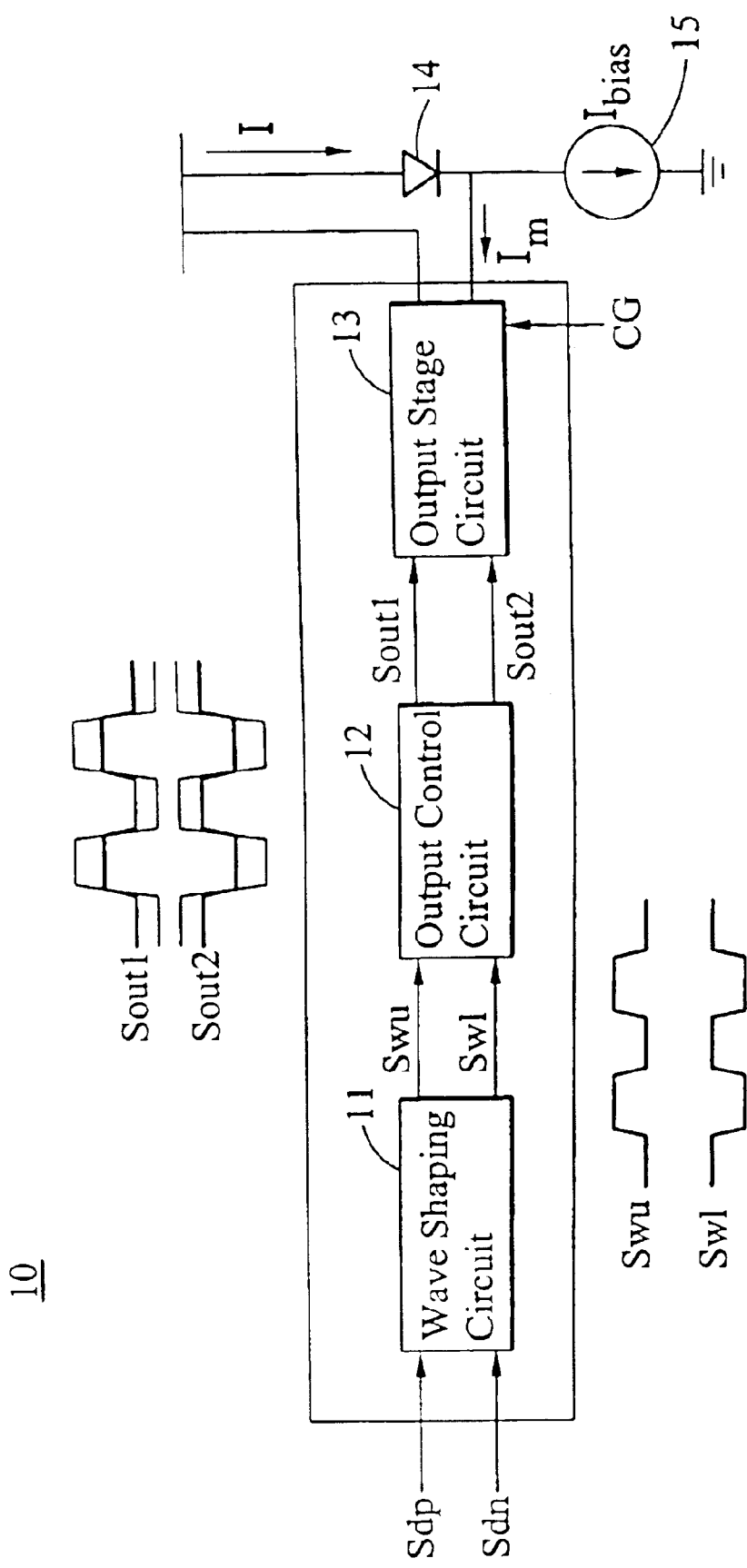
FIG. 1 is a block diagram of a typical laser driver.
Figure 2:
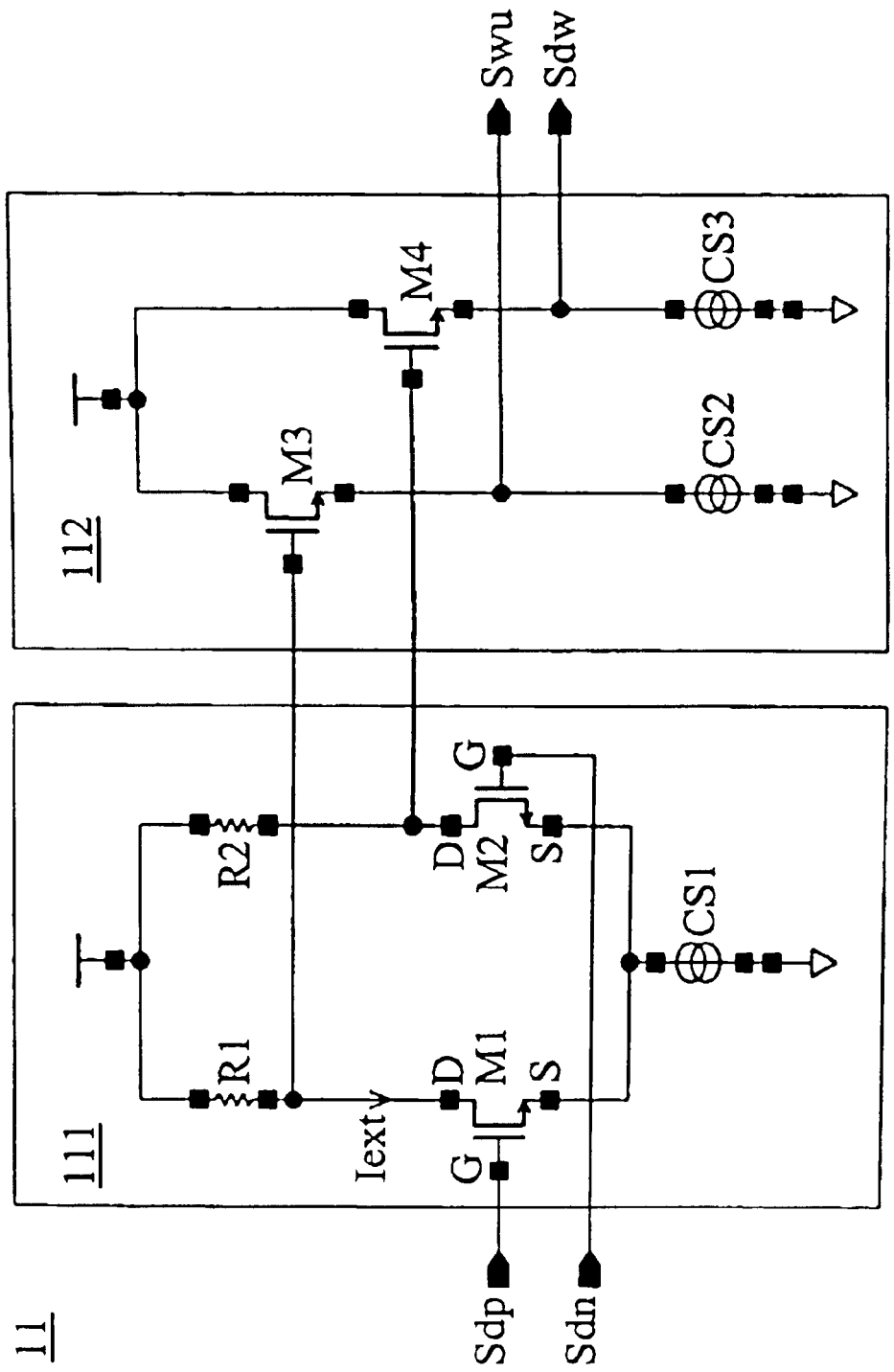
FIG. 2 is a diagram of the typical wave-shaping circuit of FIG. 1.
Figure 3:
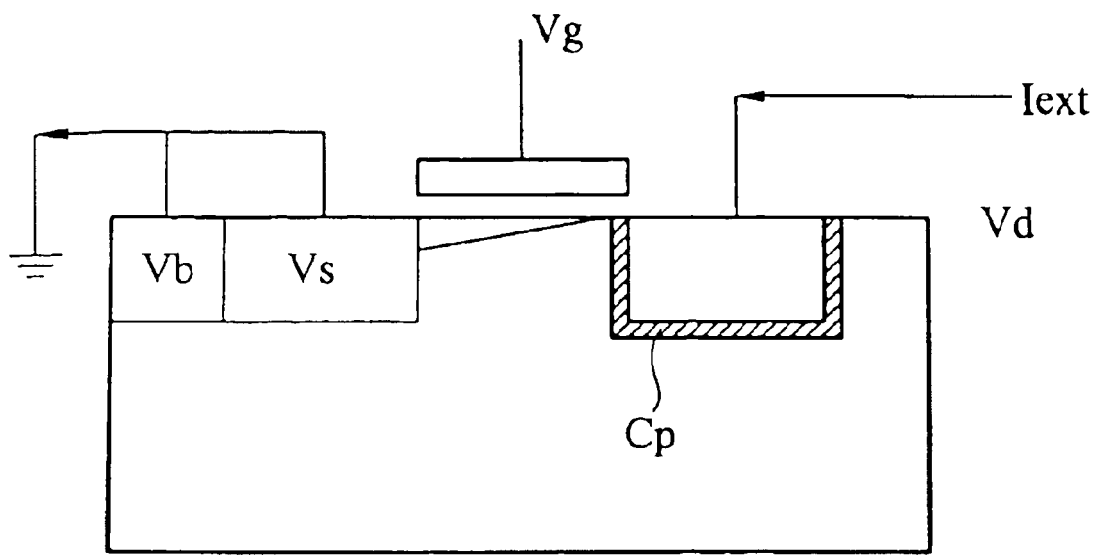
FIG. 3 is a diagram illustrating the feature of a non-ideal MOS used as a constant current source of FIG. 2.
Figure 4:
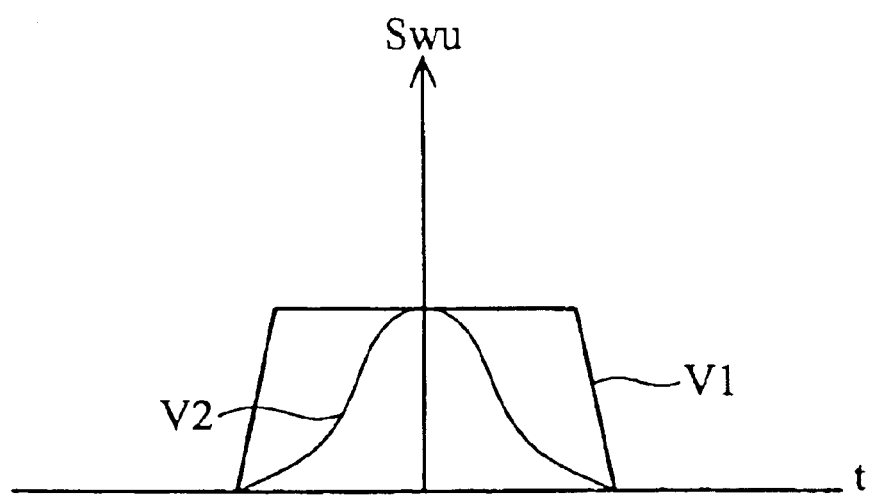
FIG. 4 is a comparison diagram of the ideal to non-ideal wave shaping output signals of FIG. 2.
Figure 5:
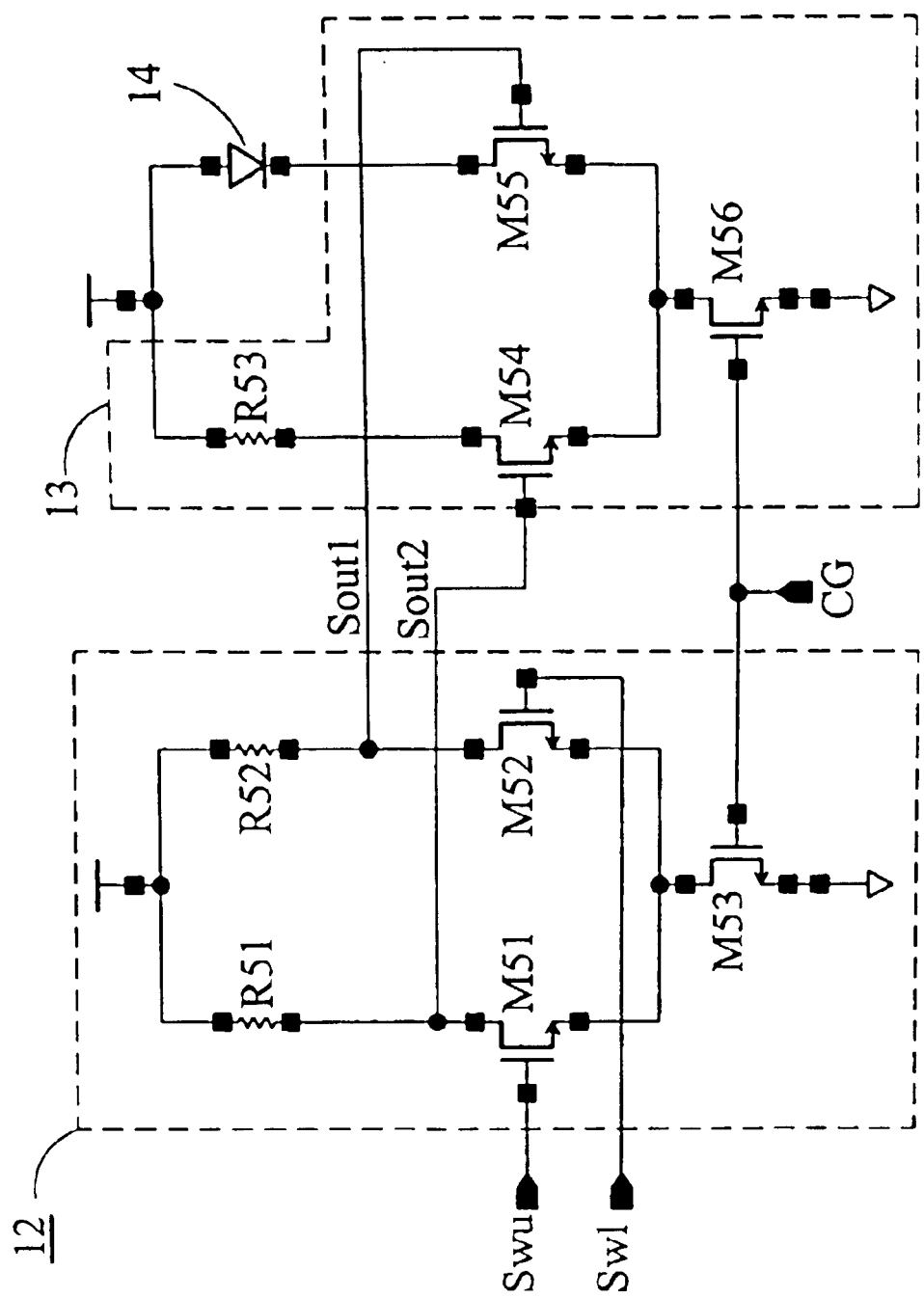
FIG. 5 is a diagram of typical output control and output stage circuits of FIG. 1.
Figure 10:
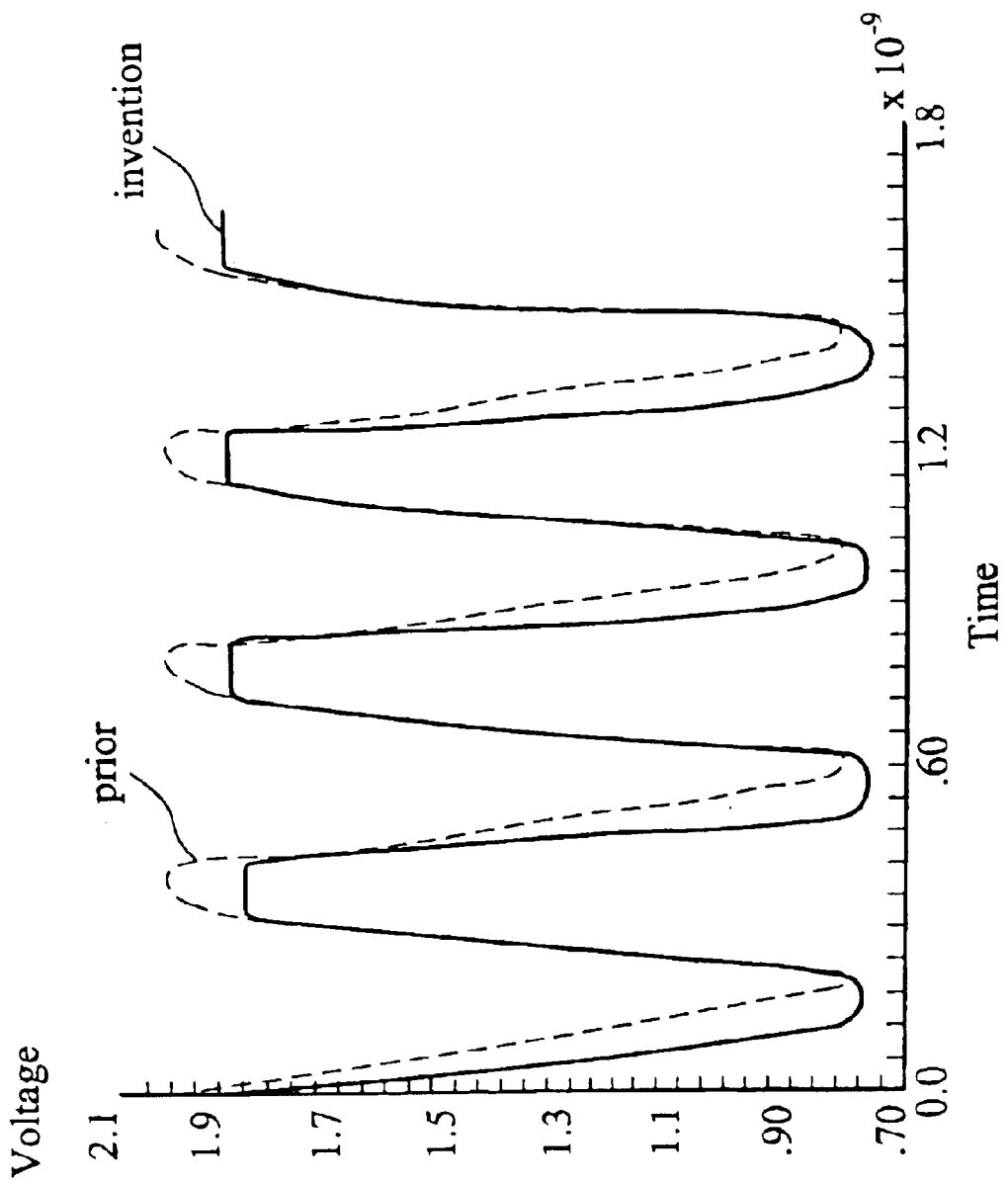
FIG. 10 is a comparison diagram of the output waveforms of the prior and invention.

FIG. 10 is a comparison of FIGS. 1 and 6. In FIG. 10, the solid line represents the invention and the dotted line represents the prior art. As shown in FIG. 10, the output waveform in the invention is the same square waveform (i.e., having platform portions on two ends of the output) as that of the input voltage and no overshoot. The output waveform in the prior art, however, has become a sine wave. By the comparison, the present invention can concurrently prevent overshoot issues and operate at high speed. Thus, during operation of the input voltage conversion between M61 and M62 or M67 and M68, the resistor, instead of the constant current source in the wave-shaping circuit, can solve speed limitation from the non-ideal features of the constant current source and increase operating speed. Moreover, additional level shift circuit in combination with a tunable device, for example a tunable resistor or a MOS, adjusts the voltage output to the output stage to prevent overshoot issues without reducing the operating speed.

Although the present invention has been described in its preferred embodiment, it is not intended to limit the invention to the precise embodiment disclosed herein. Those who are skilled in this technology can still make various alterations and modifications without departing from the scope and spirit of this invention. Therefore, the scope of the present invention shall be defined and protected by the following claims and their equivalents.

What is claimed is:

1. A high-speed laser driver including a wave-shaping circuit, the wave-shaping circuit comprising a shaping stage and a buffering stage, the shaping stage including a wave shaping differential pair, the wave shaping differential pair having a common source and a resistor, the resistor connected in series to the common source to control an output voltage swing of the wave shaping differential pair, the buffering stage including a followed differential pair, each having a gate to receive the output voltage swing, and a tunable resistance differential pair having a gate pair cross-coupled to the gates of the followed differential pair in order to adjust the tunable resistance differential pair's resistance by different operating regions and to control an output voltage of the buffering stage.

2. The high-speed laser driver of claim 1, wherein the different operating regions comprise a saturation region able to increase the tunable resistance differential pair's resistance and a triode region able to reduce the tunable resistance differential pair's resistance.

3. The high-speed laser driver of claim 1, wherein the wave shaping differential pair and the followed differential pair are a MOS pair.

4. The high-speed laser driver of claim 1, wherein the tunable resistance differential pair is a MOS pair.

5. The high-speed laser driver of claim 1, wherein the tunable resistance differential pair is a pair of resistors.

6. A high-speed laser driver, comprising:
   a first wave-shaping circuit, having a first NMOS with a source, a gate and a drain and a first resistor connected in series to the first NMOS, wherein the gate externally receives a first input voltage and the first resistor's free end is connected to an external operating voltage;
   a second wave-shaping circuit, having a second NMOS with a source, a gate and a drain and a second resistor connected in series to the second NMOS, wherein the gate externally receives a second input voltage and the second resistor's free end is connected to the external operating voltage;
   a first output swing-setting resistor, coupled between the ground and the sources of the first and second NMOSs;
   a followed differential pair, having a third NMOS with a source, a gate and a drain and a fourth NMOS having a source, a gate and a drain, wherein the drains of the third NMOS and the fourth NMOS are concurrently connected to the external operating voltage and the gates are respectively connected to a connection of the first NMOS and the first resistor and a connection of the second NMOS and the second resistor;
   a tunable resistance differential pair, having a fifth NMOS with a source, a gate and a drain and a sixth NMOS having a source, a gate and a drain, wherein the sources are grounded, the drain of the fifth NMOS is connected to the source of the third NMOS, the gate of the fifth NMOS is connected to gate of the fourth NMOS, the drain of the sixth NMOS is connected to the source of the fourth NMOS, and the gate of the sixth NMOS is connected to the gate of the third NMOS;
   a dynamic control circuit, having a first dynamic control element, a second dynamic element, a second output swing-setting resistor and a dynamic adjustment element, the first dynamic control element having a seventh NMOS with a source, a gate and a drain and a third resistor with an end connected in series to the drain of the seventh NMOS while another end is connected to the external operating voltage, the second dynamic control element having an eighth NMOS with a source, a gate and a drain and a fourth resistor with an end connected in series to the drain of the seventh NMOS while another end is connected to the external oeprating voltage, the second output swing-setting resistor connected in pallalel to the dynamic adjustment element and coupled between the ground and the sources of the first and second dynamic control elements, wherein the gate of the seventh NMOS is connected to a connection of the fourth NMOS and the sixth NMOS, the gate of the eighth NMOS is connected to a connection of the third NMOS and the fifth NMOS, and the dynamic adjustment element is grounded;
   an output stage circuit, having an output differential pair and an output current control element, the output differential pair having a ninth NMOS with a source, a gate and a drain and a tenth NMOS with a source, a gate and a drain, the output current control element having an eleventh NMOS with a source, a gate and a drain,
   wherein the drain of the ninth NMOS is connected to the external operating voltage through a resistor and the gate of which is connected to the first dynamic control element, the drain of the tenth NMOS is connected to the external operating voltage through a laser diode and the gate of which is connected to the second dynamic control element, the drain of the eleventh NMOS is connected to the drains of the ninth and tenth NMOSs, the gate of the eleventh NMOS is connected to an external control voltage, and the source of the eleventh NMOS is grounded;
   a shift circuit, having a first PMOS with a source, a gate and a drain, a second PMOS with a source, a gate and a drain, a twelfth NMOS with a source, a gate and a drain, and a shift resistor, wherein the sources of the first PMOS and the second PMOS are connected to the external operating voltage and the gates of which are connected to the drain of the second PMOS, the twelfth NMOS is connected between the ground and the drain of the second PMOS and the gate of which is connected to the external control voltage, the shift resistor is connected between the ground and the drain of the first PMOS to form an output node connecting to the dynamic adjustment element.

7. The high-speed laser driver of claim 6, wherein the first and second input voltages have same swings but opposite polarities.

8. The high-speed laser driver of claim 6, wherein the dynamic adjustment element is an NMOS.

9. The high-speed laser driver of claim 6, wherein the dynamic adjustment element is a tunable resistor.

10. The high-speed laser driver of claim 6, wherein the tunable resistance differential pair is equivalent to a pair of tunable resistors.

11. A high-speed laser driver, comprising:
    a plurality of cascade wave-shaping circuits, having a MOS differential input pair and a MOS differential output pair, to receive an external sine wave signal via the MOS differential input pair and output a square wave signal via the MOS differential output pair;
    a dynamic control circuit, having a MOS differential input pair, a dynamic adjustment element and a MOS output pair, to receive the square wave signal via the MOS differential input pair, adjust the square wave signal by the dynamic adjustment element and output the square wave signal adjusted by the dynamic adjustment element via the MOS differential output pair;
    an output stage circuit, having a MOS differential input pair and a first gate-controlled element, to receive the square wave signal from the dynamic control circuit via the MOS differential input circuit pair and to receive an external control voltage via the first gate-controlled element in order to control a current flowing through an external laser diode so that the external laser diode outputs the square signal; and
    a shift circuit, having a second gate-controlled element and a tunable resistor, to receive the external control voltage via the second gate-controlled element in order to tune the step-down voltage on the tunale and control the dynamic adjustment element so that the square wave signal is not deformed when output by the external laser diode.

12. The high-speed laser driver of claim 11, wherein the dynamic adjustment element is a MOS.

13. The high-speed laser driver of claim 11, wherein the dynamic adjustment element is a tunable resistor.

* * * * *